United States Patent [19]

Imazeki et al.

[11] Patent Number: 4,502,026

[45] Date of Patent: Feb. 26, 1985

[54] SIGNAL DISTRIBUTING APPARATUS

[75] Inventors: Kazuyoshi Imazeki; Hisashi Wani, both of Tokyo, Japan

[73] Assignee: General Research of Electronics, Inc., Tokyo, Japan

[21] Appl. No.: 471,894

[22] Filed: Mar. 3, 1983

[30] Foreign Application Priority Data

Apr. 1, 1982 [JP] Japan ................... 57-54983

[51] Int. Cl.³ .......................... H03H 7/48; H04B 1/16
[52] U.S. Cl. ..................................... 333/101; 333/105; 333/25; 358/181; 455/3
[58] Field of Search ................. 333/103–107, 333/101, 25; 455/3, 133; 381/81; 358/181, 188; 340/825.79

[56] References Cited

U.S. PATENT DOCUMENTS

| 3,484,548 | 12/1969 | Kowal et al. | 358/181 |
| 3,833,866 | 9/1974 | Boutelant | 333/103 X |
| 4,275,365 | 6/1981 | Ando | 333/119 X |
| 4,276,562 | 6/1981 | Stewart et al. | 455/3 X |
| 4,399,439 | 8/1983 | Upadhyayula | 333/101 X |

FOREIGN PATENT DOCUMENTS 817766 10/1951 Fed. Rep. of Germany ...... 333/101

Primary Examiner—Paul Gensler
Attorney, Agent, or Firm—Trexler, Bushnell & Wolters, Ltd.

[57] ABSTRACT

A signal distribution apparatus for selectively coupling each of a plurality of inputs to one or both of two outputs substantially without interference between the inputs or the outputs. The signal distributing apparatus comprises a plurality of input terminals and balanced couplers, such as balun coils, for providing a balanced line from each input terminal. A switching network is coupled intermediate the balanced couplers and the two outputs for selectively and individually coupling each balanced line to one or both of the outputs.

9 Claims, 1 Drawing Figure

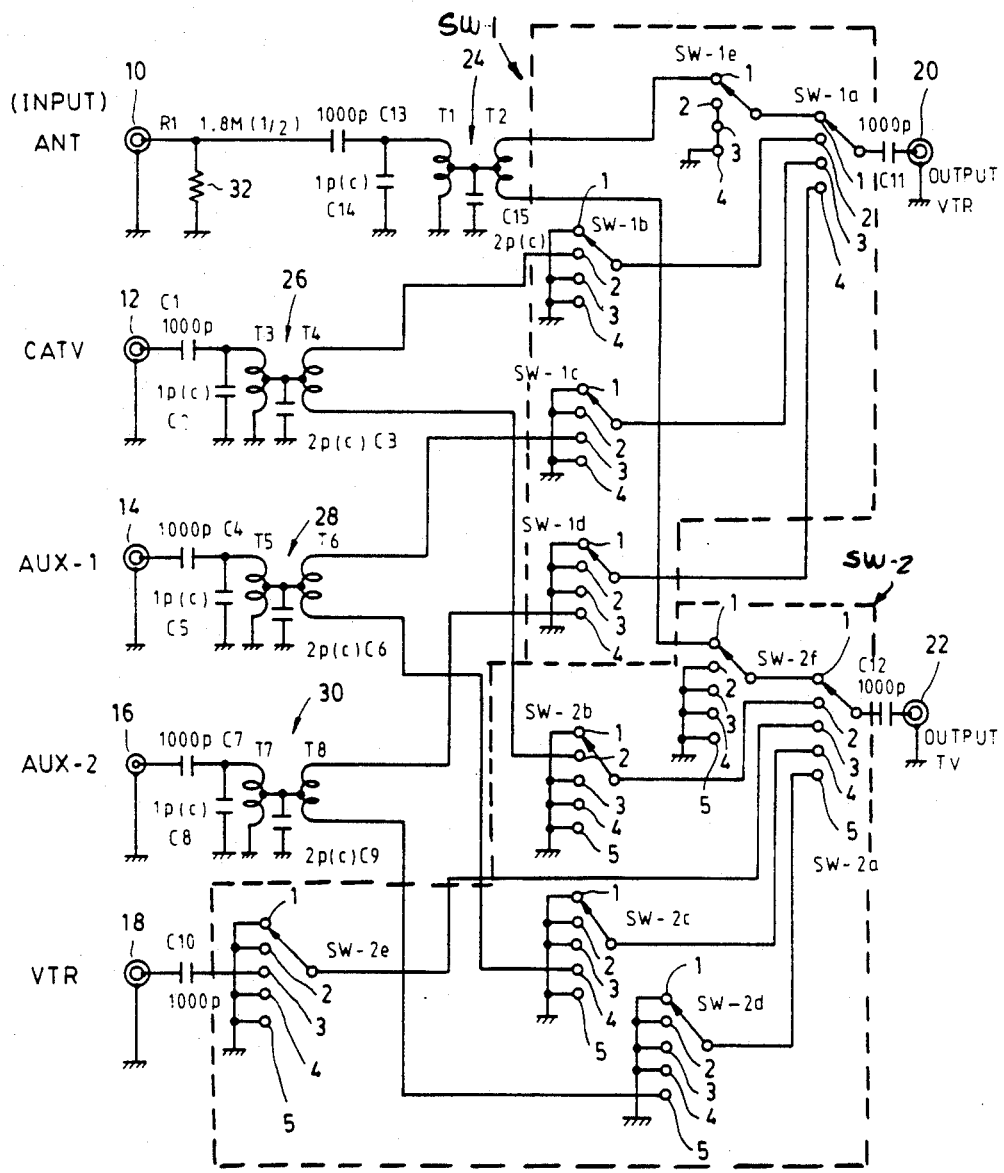

4,502,026

SIGNAL DISTRIBUTING APPARATUS

BACKGROUND OF THE INVENTION

This invention is directed generally to signal distribution apparatus and more particularly to such apparatus for selectively connecting a selected one of a plurality of inputs or source signals to each, either or both of two outputs or utilization devices.

One such signal distribution apparatus or switching device is commonly known as a video selector. In such a video selector, one or more input devices, for example, a television antenna, cable television lead, a home computer or video game, and a video tape or cassette recorder or video disc player may be selected for play through an ordinary television receiver, or alternatively for recording information therefrom on a second video tape or cassette recorder. While the invention is not limited thereto, the ensuing discussion will be facilitated by specific reference to such a video selector apparatus.

In general, a number of problems are associated with the switching of multiple inputs to multiple outputs. For example, interference among the various inputs or among the various outputs is to be avoided. Additionally, interference between any unselected inputs and the outputs must be minimized. Moreover, it is important to transfer signals from a selected input to a selected output substantially without distortion, noise or the like being imposed on the signal while also minimizing any signal loss in the process.

The prior art has devised switching devices which take into account and substantially avoid many of the foregoing problems. However, such switching devices have heretofore been relatively complex and expensive in their design and manufacture.

OBJECTS AND SUMMARY OF THE INVENTION

Accordingly, it is a general object of this invention to provide a novel and improved signal distributing apparatus.

A more specific object is to provide an apparatus of the foregoing type which is adapted to distribute selected ones of a plurality of inputs to selected ones of a plurality of outputs while substantially avoiding the problems of interference, distortion and noise, and input losses discussed above.

A further object is to provide an apparatus in accordance with the foregoing objects which is relatively simple and inexpensive in its design and manufacture and yet highly reliable in operation.

Briefly, and in accordance with the foregoing objects, the present invention provides a signal distribution apparatus for selectively coupling one of a plurality of inputs to one or both of two outputs substantially without interference between said inputs or said outputs. The signal distribution apparatus comprises a plurality of input terminals, balanced coupling means for providing a balanced line from each said input terminal, two output terminals, and switching means coupled intermediate said balanced coupling means and said two output terminals for selectively coupling each said balanced line to one or both of said output terminals.

BRIEF DESCRIPTION OF THE DRAWINGS

The foregoing as well as other objects, features and advantages of the pesent invention will be more readily appreciated upon reading the following detailed description of the illustrated embodiment, together with reference to the single FIGURE of drawing, wherein a signal distributing apparatus in accordance with the invention is illustrated in circuit schematic form.

DETALED DESCRIPTION OF THE ILLUSTRATED EMBODIMENT

While the present invention is not limited thereto, the description will be hereinafter facilitated by specific reference to a video selector apparatus.

Referring now to the drawing, a signal distributing apparatus in accordance with the invention receives input signals from a plurality of sources to be hereinafter described at input terminals designated by reference numerals 10, 12, 14, 16 and 18. In accordance with the invention, selected ones of these input signals are fed to one or both of a pair of output terminals 20 and 22. In the illustrated embodiment, the input terminal 10 is designated as a television antenna input (ANT), the input 12 is designated as a cable television input (CATV) and the inputs 14 and 16 are designated as auxiliary source inputs (AUX-1, AUX-2). The remaining input terminal 18 is designated as a video recorder device or video tape recorder (VTR) input.

Accordingly, the foregoing inputs receive signals from the devices or signal sources indicated by the associated designations. In this regard, the auxiliary inputs 14, 16 may receive signals from any of a plurality of devices such as a computer or video game, a video disc player, a second video cassette or tape recorder, or the like.

In the illustrated embodiment the first output 20 is coupled to feed the input of a video cassette or tape recorder (VTR) while the output 22 is coupled to feed a television receiver or monitor (TV). In this regard, it will be noted that the output 20 in the illustrated embodiment feeds an input to the same video tape recorder which provides its output as an input signal to the input terminal 18. Hence, as will be seen later no provision is made for interconnection of this latter input terminal 18 with the output terminal 20. However, as mentioned above, one of the auxiliary terminals 14, 16 may readily be utilized to accommodate a second such video tape recorder (VTR) or similar device.

Each of the input terminals 10, 12, 14 and 16 is provided with a suitable coupling capacitor (1000 pf), the antenna input 10 being additionally provided with a conventional input matching resistor 32, preferably of 1.8 megohm value.

Each of the coupling capacitors feeds the input side of one of a plurality of balanced coupling devices 24, 26, 28, 30, which in the illustrated embodiment comprise balanced coils of the type generally known in the art as balun coils. The distributed capacitances associated with such a balun coil are also respectively illustrated as a parallel input capacitance of on the order of 1 pf and a distributed capacitance of on the order of 2 pf.

The outputs of these balun coils 24, 26, etc., comprise balanced lines. As known in the art, a balanced line comprises two identical conductors, each of which is operated (from the output of its respective coil 24, 26, etc.) so that the voltages on the two conductors are equal in magnitude and opposite in polarity with respect to ground and hence the currents on the two conductors are equal in magnitude and opposite in direction at all times. Such balanced lines are highly desirable where minimum noise and cross-talk are desired. Moreover, input losses are minimized by this arrangement. Accordingly, the two outputs of each of these balun coils 24, 26, etc., are substantially identical to the input signals received on the associated input terminal, but are substantially free of cross-talk or other interference therebetween. For example, the TV antenna signal received at the input terminal 10 is fed through and substantially identically reproduced on the two outputs conductors of the coil 24, substantially without cross-talk, input losses or interference therebetween and substantially without the addition of any noise or other distortion.

A first switch SW-1 comprises a five-circuit, four-contact switch, and preferably comprises a conventional rotary switch. The five-contact circuits are designated respectively SW-1a, SW-1b, SW-1c, SW-1d and SW-1e. Each of the respective contact circuits has four contact positions, indicated by the like reference numerals 1, 2, 3 and 4. The switching of the input signals from the respective input terminals 10, 12, 14 and 16 to the first or VTR output terminal 20 is effected by this first switch SW-1. In this regard, one output conductor of the coil 24 feeds the position 1 contact of the contact circuit SW-1e. Similarly, one output conductor of the coil 26 feeds the contact position 2 of the contact circuit SW-1b. In like fashion, one output conductor of the coil 28 feeds the contact position 3 of the contact circuit SW-1c and one output conductor of the coil 30 feeds the contact position 4 of the contact circuit SW-1d.

The contact circuit SW-1a has each of its contact positions wired to the movable contactor of one of the respective contact circuits SW-1b, SW-1c, SW-1d and SW-1e. The movable contactor of the contact circuit SW-1a feeds the output terminal 20 by way of a suitable coupling capacitor, which is on the order of 1000 pf. It will be recognized that the contact circuits of switch SW-1 all operate in unison, that is, all movable contactors will contact the like-numbered ones of their respective contact positions 1, 2, 3 and 4 in unison. It will also be noted that the contact positions of each of the contact circuits SW-1b, -1c, -1d and -1e not coupled to a respective coil output as described above are tied to circuit ground.

In operation, the foregoing switch SW-1 thus serves to select one and only one of the signals at inputs 10, 12, 14 and 16 fed through one side of the associated balanced line to the output terminal 20. The other or unselected contact positions of the contact circuit SW-1a are held tied to circuit ground. Advantageously, this eliminates any possible source of distortion, interference or noise which might otherwise disturb the signal being fed through the selected contact position of the contact circuit SW-1a to this output terminal 20.

Referring now to the second or TV output terminal 22, it will be seen that a similar switch SW-2 is provided intermediate the outputs of the coils 24, 26, etc., and this latter output 22. Additionally, the switch SW-2 serves to selectively couple the signal from the VTR input terminal 18 with this TV output terminal 22. In this regard, the second switch SW-2 is a six-circuit, five-contact switch in the illustrated embodiment, including six contact circuits designated respectively SW-2a, SW-2b, SW-2c, SW-2d, SW-2e and SW-2f. Preferably, this switch SW-2 is also a conventional rotary-type switch, whereby it will be understood that the movable contactors associated with the foregoing contact circuits all move in unison to engage the like-numbered contact positions thereof.

In similar fashion to the first switch SW-1, the first contact circuit SW-2a of the second switch SW-2 has its movable contactor coupled to feed the TV output terminal 22 by way of a suitable coupling capacitor, preferably of on the order of 1000 pf. The five-contact positions of the contact circuit SW-1a are respectively coupled to the movable contacts of the remaining contact circuits SW-2b, -2c, -2d, -2e and -2f.

In the illustrated embodiment, the contact circuit SW-2b has its contact position 2 coupled to the remaining output conductor from the coil 26 associated with the CATV input 12, the remaining contact positions 1, 3, 4 and 5 thereof being tied to circuit ground. Similarly, the contact circuit SW-2c has its contact position 4 coupled to the remaining output conductor from the coil 28 and the remaining contact positions thereof tied to circuit ground. In like fashion, the contact circuit SW-2d has its contact position 5 coupled to the remaining output conductor from the coil 30 and its remaining contact positions tied with circuit ground. The contact circuit SW-2e has its contact position 3 coupled by way of a suitable capacitor (1000 pf) to the VTR input terminal 18 and its remaining contact positions tied to circuit ground. The remaining contact circuit SW-2f has its contact position 1 coupled to the remaining output conductor of the coil 24 and its remaining contact positions tied to circuit ground.

In operation, the switch SW-2 is similar to the switch SW-1 in that it permits the signal from one and only one of the inputs 10, 12, 14, 16 and 18 to be fed to the TV output terminal 22. In this regard, it will be seen that the unselected contact positions of the contact circuit SW-2a will be tied to circuit ground. Accordingly, any possible interference or noise from the unselected inputs will be substantially eliminated from the output terminal 22.

From the foregoing description, it will be seen that the illustrated and described circuit is relatively simple in its design and operation, yet this circuit reliably switches a plurality of inputs to one or more of a plurality of outputs substantially without interference between inputs or outputs and, moreover, substantially without either input losses or the addition of any noise or distortion to the selected signals. Moreover, the use of the balun coils 24, 26, etc., as couplers substantially assures that the same selected input signal may be fed to both outputs 20, 22 (if desired) substantially without interference therebetween and substantially without input losses. Moreover, if desired, the separate provision of the switches SW-1 and SW-2 permit switching of a different input source to each of the respective outputs 20 and 22 without interference therebetween as not only are the switching circuits SW-1 and SW-2 independent but the balun coils 24, 26, etc., substantially preclude any interference or cross-talk between their outputs.

While the invention has been illustrated and described with reference to a preferred embodiment, the invention is not limited thereto. Those skilled in the art may devise various alternatives, changes and modifications upon reading the foregoing description. The invention includes such alternatives, changes and modifications insofar as they fall within the spirit and scope of the appended claims.

The invention is claimed as follows:

1. A signal distributing apparatus for distributing each of a plurality of input signals to one or more of a plurality of utilization devices comprising: a plurality of input terminals, each coupled to receive one of said plurality of input signals; a plurality of output terminals respectively coupled to said plurality of utilization devices; a plurality of coupling means respectively coupled intermediate said input terminals and said output terminals for receiving the input signals from said plurality of input terminals; a plurality of switching means respectively coupled intermediate said plurality of coupling means and said plurality of output terminals for selectively interconnecting each of said coupling means with each of said plurality of output terminals; said coupling means comprising means for coupling the input signals to the switching means substantially without interference between the input signals or between the output utilization devices and substantially without input losses; wherein said plurality of utilization devices comprises first and second utilization devices; wherein said plurality of output terminals comprises first and second output terminals; wherein said coupling means comprises means for providing balanced lines from each of said input terminals to both of said output terminals; wherein said switching means comprises a first switch including a movable contactor coupled to said first ouput terminal and a plurality of fixed contacts; and a plurality of second switches, each including a movable contactor and a plurality of fixed contacts; said movable contactors of said second switches being respectively coupled with selected ones of the fixed contacts of said first switch, one fixed contact of each said second switch being coupled with one of said balanced lines, and the remaining fixed contacts of each second switch being coupled with circuit ground.

2. A signal distributing apparatus in acordance with claim 1 wherein each said coupling means comprises a balun coil including a coil input and a pair of coil outputs defining said balanced line; said coil inputs being respectively coupled with the plurality of input terminals and each pair of coil outputs being respectively coupled through said switching means with said first and second output terminals.

3. A signal distributing apparatus in accordance with claim 1 wherein the movable contactors of said first switch and of said plurality of second switches are ganged together to operate in unison.

4. A signal distributing apparatus in accordance with claim 1 wherein said switching means further comprises: a third switch including a movable contactor coupled to said second output terminal and a plurality of fixed contacts; and a plurality of fourth switches, each including a movable contactor and a plurality of fixed contacts; one fixed contact of each fourth switch being coupled to one of said balanced lines, the remaining fixed contacts of each said fourth switch being coupled with circuit ground, and the movable contactors of said fourth switches being respectively coupled with selected ones of the fixed contacts of said third switch.

5. A signal distributing apparatus in accordance with claim 4 wherein said movable contactors of said third switch and of said plurality of fourth switches are ganged together to operate in unison.

6. A signal distributing apparatus in accordance with claim 5 wherein said plurality of coupling means comprises a plurality of balun coils, each having a coil input and a pair of coil outputs; said coil inputs being respectively coupled with said plurality of input terminals and each pair of coil outputs comprising one of said balanced lines.

7. A signal distributing apparatus in accordance with claim 1 wherein one of said utilization devices additionally supplies an additional input signal to an additional input terminal.

8. A signal distributing apparatus according to claim 7 wherein said plurality of switching means are also coupled intermediate said additional input terminal and one of said output terminals.

9. A signal distributing apparatus for distributing each of a plurality of input signals to one or more of a plurality of utilization devices comprising: a plurality of input terminals, each coupled to receive one of said plurality of input signals; a plurality of output terminals respectively coupled to said plurality of utilization devices; a plurality of coupling means respectively coupled intermediate said input terminals and said output terminals for receiving the input signals from said plurality of input terminals; a plurality of switching means respectively coupled intermediate said plurality of coupling means and said plurality of output terminals for selectively interconnecting each of said coupling means with each of said plurality of output terminals; said coupling means comprising means for coupling the input signals to the switching means substantially without interference between the input signals or between the output utilization devices and substantially without input losses; wherein said plurality of utilization devices and said plurality of output terminals are respectively two in number; and wherein one of said two utilization devices additionally supplies an additional input signal to an additional input terminal.

* * * * *